(12) United States Patent
Thibodeau et al.

(10) Patent No.: US 11,808,819 B2
(45) Date of Patent: Nov. 7, 2023

(54) REAL TIME BACKUP BATTERY LIFE CHECK

(71) Applicant: Dell Products L.P., Round Rock, TX (US)

(72) Inventors: Thomas R. Thibodeau, Whitinsville, MA (US); Haijin Zhang, Fujian (CN); Cui Xizhi, Shanghai (CN)

(73) Assignee: DELL PRODUCTS L.P., Round Rock, TX (US)

( * ) Notice: Subject to any disclaimer, the term of this patent is extended or adjusted under 35 U.S.C. 154(b) by 55 days.

(21) Appl. No.: 17/507,658

(22) Filed: Oct. 21, 2021

(65) Prior Publication Data

US 2023/0129347 A1    Apr. 27, 2023

(51) Int. Cl.
*G01R 31/392* (2019.01)
*G01R 31/396* (2019.01)
*G01R 31/389* (2019.01)
*G01R 31/36* (2020.01)

(52) U.S. Cl.
CPC ......... *G01R 31/392* (2019.01); *G01R 31/389* (2019.01); *G01R 31/396* (2019.01); *G01R 31/3648* (2013.01)

(58) Field of Classification Search
CPC .. G01R 31/392; G01R 31/389; G01R 31/396; G01R 31/3648
See application file for complete search history.

(56) References Cited

U.S. PATENT DOCUMENTS

| | | | |
|---|---|---|---|
| 6,121,752 A | * | 9/2000 | Kitahara .......... H02J 7/005 320/122 |
| 2012/0200266 A1 | * | 8/2012 | Berkowitz .......... H01M 10/44 320/139 |
| 2019/0051947 A1 | * | 2/2019 | Scheucher .......... B60L 53/302 |
| 2019/0094307 A1 | * | 3/2019 | Brebant .......... G01R 31/389 |
| 2019/0148701 A1 | * | 5/2019 | Ashrafzadeh .......... H02J 7/0014 429/158 |
| 2021/0006077 A1 | * | 1/2021 | Rentel .......... H02J 7/0014 |
| 2022/0031106 A1 | * | 9/2022 | Nedjimi .......... H01M 10/54 |

* cited by examiner

*Primary Examiner* — Catherine T. Rastovski
*Assistant Examiner* — Lal C Mang
(74) *Attorney, Agent, or Firm* — Chamberlain, Hrdlicka, White, Williams & Aughtry

(57) ABSTRACT

A Battery Backup (BBU) device, method, and system is disclosed. A BBU cell includes a battery with an internal impedance. The BBU cell includes monitoring circuitry connected to the battery for monitoring a Status of Health (SOH) of the battery. The monitoring circuitry includes a MOSFET and a resistor connected in series and a master control unit connected to the MOSFET for controlling the MOSFET and determining the SOH of the battery.

17 Claims, 4 Drawing Sheets

REAL TIME BACKUP BATTERY LIFE CHECK

BACKGROUND

Backup Battery Units (BBUs) have been widely used in computer storage hardware platform products to provide a backup energy source during power outages. Such BBUs are used to save the data in the storage hardware in the event of a loss of power. BBUs are a vital element to ensure high reliability and prevent data loss or data unavailability events in storage hardware devices. The energy capacity of the cells that comprise a BBU degrade over time; therefore, battery management systems may be employed to monitor the health of batteries in a BBU.

SUMMARY

In general, in one aspect, embodiments disclosed herein are directed to a BBU cell that includes a battery with an internal impedance. The BBU cell includes monitoring circuitry connected to the battery for monitoring a Status of Health (SOH) of the battery. The monitoring circuitry includes a MOSFET and a resistor connected in series and a master control unit connected to the MOSFET for controlling the MOSFET and determining the SOH of the battery.

In another aspect, embodiments disclosed herein are directed to a method of determining the SOH of a BBU that includes measuring an open circuit voltage of monitoring circuitry connected to a battery of the BBU. The monitoring circuitry comprising a MOSFET and a resistor connected in a series. The method also includes turning on the MOSFET connected in series to the resistor, measuring an output voltage of the BBU, and determining the SOH of the battery using the open circuit voltage and the output voltage of the BBU after the MOSFET has been enabled.

In another aspect, embodiments disclosed herein are directed to a system for providing backup power that includes a storage system of one or more storage units. The system includes a BBU for providing a power source to the one or more storage units. The BBU includes one or more BBU cells, where each BBU cell includes a battery with an internal impedance and monitoring circuitry connected to the battery for monitoring a SOH of the battery. The monitoring circuitry includes a MOSFET and a resistor connected in a and a Microcontroller (MCU), or other digital hardware, connected to the MOSFET for controlling the MOSFET and determining the SOH of the battery.

BRIEF DESCRIPTION OF DRAWINGS

Certain embodiments of the invention will be described with reference to the accompanying drawings. However, the accompanying drawings illustrate only certain aspects or implementations of the invention by way of example and are not meant to limit the scope of the claims.

DETAILED DESCRIPTION

Figure 1:
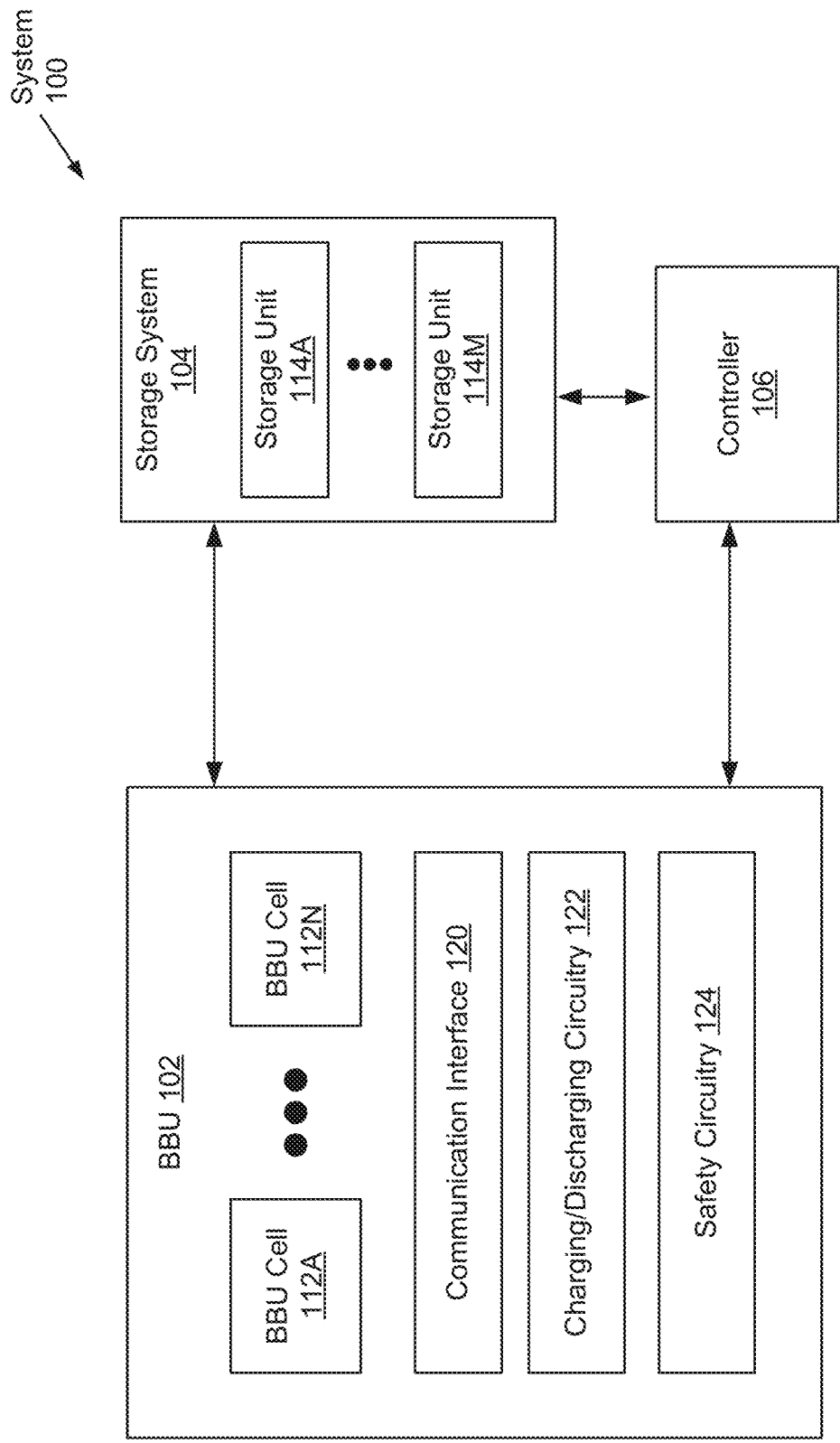
FIG. 1 shows a schematic of a system in accordance with one or more embodiments disclosed herein.

Specific embodiments will now be described with reference to the accompanying figures.

In the below description, numerous details are set forth as examples of embodiments described herein. It will be understood by those skilled in the art, that have the benefit of this Detailed Description, that one or more embodiments described herein may be practiced without these specific details and that numerous variations or modifications may be possible without departing from the scope of the embodiments described herein. Certain details known to those of ordinary skill in the art may be omitted to avoid obscuring the description.

In the below description of the figures, any component described with regard to a figure, in various embodiments described herein, may be equivalent to one or more like-named components described with regard to any other figure. For brevity, descriptions of these components may not be repeated with regard to each figure. Thus, each and every embodiment of the components of each figure is incorporated by reference and assumed to be optionally present within every other figure having one or more like-named components.

Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments disclosed herein relate to a device, system, and method for performing a real-time health check for cells of a BBU. Embodiments provide an innovative method to perform BBU real-time health checking of BBU cells to obtain a Status of Health (SOH) of the BBU cells. Embodiments advantageously provide an SOH value for in-service BBUs without interrupting normal system operations.

In embodiments disclosed herein, a battery SOH algorithm based on battery impedance track provides an electrical circuit and firmware design capable of operating without any interventions from a system side.

More specifically, embodiments disclosed herein provide a hardware (HW) circuit and firmware (FW) design to obtain a real-time SOH (Status of Health). Embodiments may provide a SOH value for in-service BBU, without interrupting normal system operation. Embodiments may overcome traditional Battery Management System (BMS) constraints in storage system applications, from both an accuracy and a real-time perspective.

For example, a traditional BMS may use impedance tracking to compare a present storage capacity, deliverable capacity, and cell impedance associated with the battery. Such systems use a gas gauge to determine the necessary information and models to calculate a remaining capacity. The necessary information may include chemical (i.e., depth of discharge and the total chemical capacity); electrical (i.e., internal battery resistance dependence); and external (i.e., load of battery and temperature) information. Such systems usually require a cooler temperature range and a larger discharging depth.

In embodiments disclosed herein, a battery SOH algorithm based on battery impedance track provides an electrical circuit and firmware design capable of operating without any interventions from a system side. Because the design is controlled from within the BBU, no additional burdens need to be added to a platform design when employing the BBU. Further, employment of the BBU in legacy systems may have minimal impact in accordance with embodiments disclosed herein.

FIG. 1 shows a schematic of a system in accordance with one or more embodiments disclosed herein. The system (100) includes a BBU system (102), a storage system (104), and controller (106). The storage system (104) may include one or multiple storage units (114A . . . 114M) that utilize the BBU system (102) as a battery backup. The storage units may be any combination of persistent and/or non-persistent storage (e.g., cache memory). The system may also include a controller (106) for managing the storage system.

Embodiments of the BBU system (102) may include one or multiple BBU cells (112A . . . 112N). The BBU cells are described below with respect to FIG. 2. The BBU system (102) may also include a communication interface (120), charging/discharging circuitry (122), and safety circuitry (124). The communication interface (120) may be included to communicate with other elements in the system (100). For example, the communication interface (120) may facilitate communication with the controller (106) to control operation of the charging/discharging circuitry (122). The charging/discharging circuitry (122) is circuitry for charging or discharging one or more of the BBU cells (112A . . . 112N). The safety circuitry (124) is additional circuitry that may be included to ensure the safe operation of the BBU system (102).

One of ordinary skill in the art will appreciate that embodiments disclosed herein are not limited to the system disclosed in FIG. 1. For example, the BBU cells may be distributed throughout the storage system; the storage system may include multiple devices in multiple locations; the controller and storage systems may be connected through various networks; and other configurations may be envisioned in accordance with embodiments disclosed herein.

Figure 2:
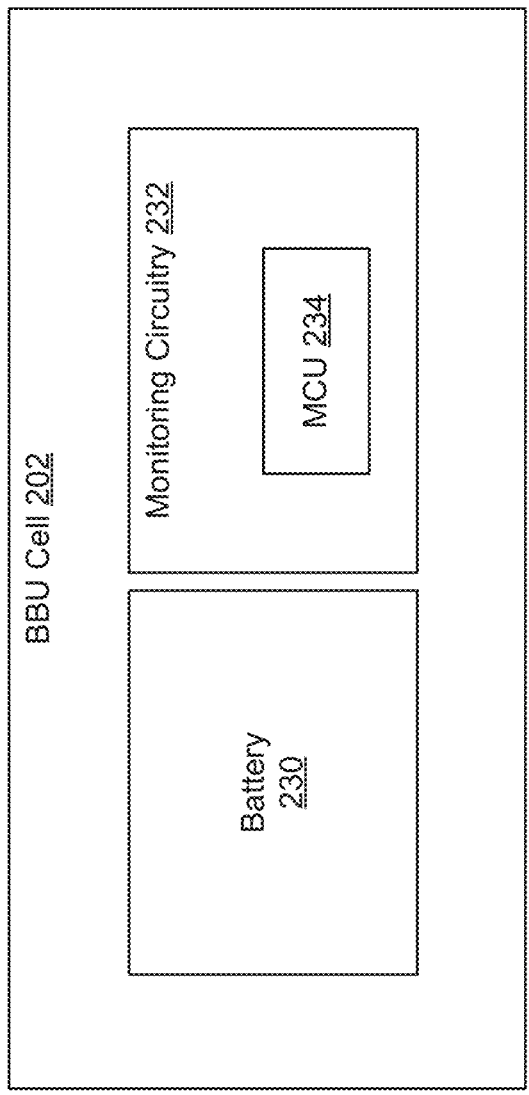
FIG. 2 shows a schematic of a BBU in accordance with one or more embodiments disclosed herein.

FIG. 2 shows a schematic of a BBU cell in accordance with one or more embodiments disclosed herein. The BBU cell (202) includes a battery (230) and monitoring circuitry (232) in accordance with embodiments disclosed herein. The battery (230) may be a lithium ion battery; however, embodiments are not limited as such. The monitoring circuitry (232) includes a master control unit (MCU) (234) that controls aspects of the monitoring circuitry (232) to obtain and evaluate a SOH in real time in accordance with embodiments disclosed herein. Aspects of the monitoring circuitry (232) and MCU (234) are described below with respect to FIGS. 3-4. In embodiments disclosed herein, the MCU may be executed using firmware associated with the monitoring circuitry (232).

Embodiments of the BBU cell may also include electrical connections (not shown), for example, connecting the BBU cell to a communication interface (120), charging/discharging circuitry (122), and safety circuitry (124) as described in FIG. 1. The BBU cell may include power connections for supplying battery power to devices, such as one or more storage units (114A . . . 114M), in the system. The BBU cell may include a voltage input for the MCU/monitoring circuitry. For example, the BBU cell may include connections for 12 V of output, and use 3V input to operate.

One of ordinary skill in the art will appreciate that embodiments disclosed herein are not limited to the BBU cell disclosed in FIG. 2. For example, a communication interface, charging/discharging circuitry, and/or safety circuitry may be incorporated into the BBU cell in accordance with embodiments disclosed herein.

Figure 3:
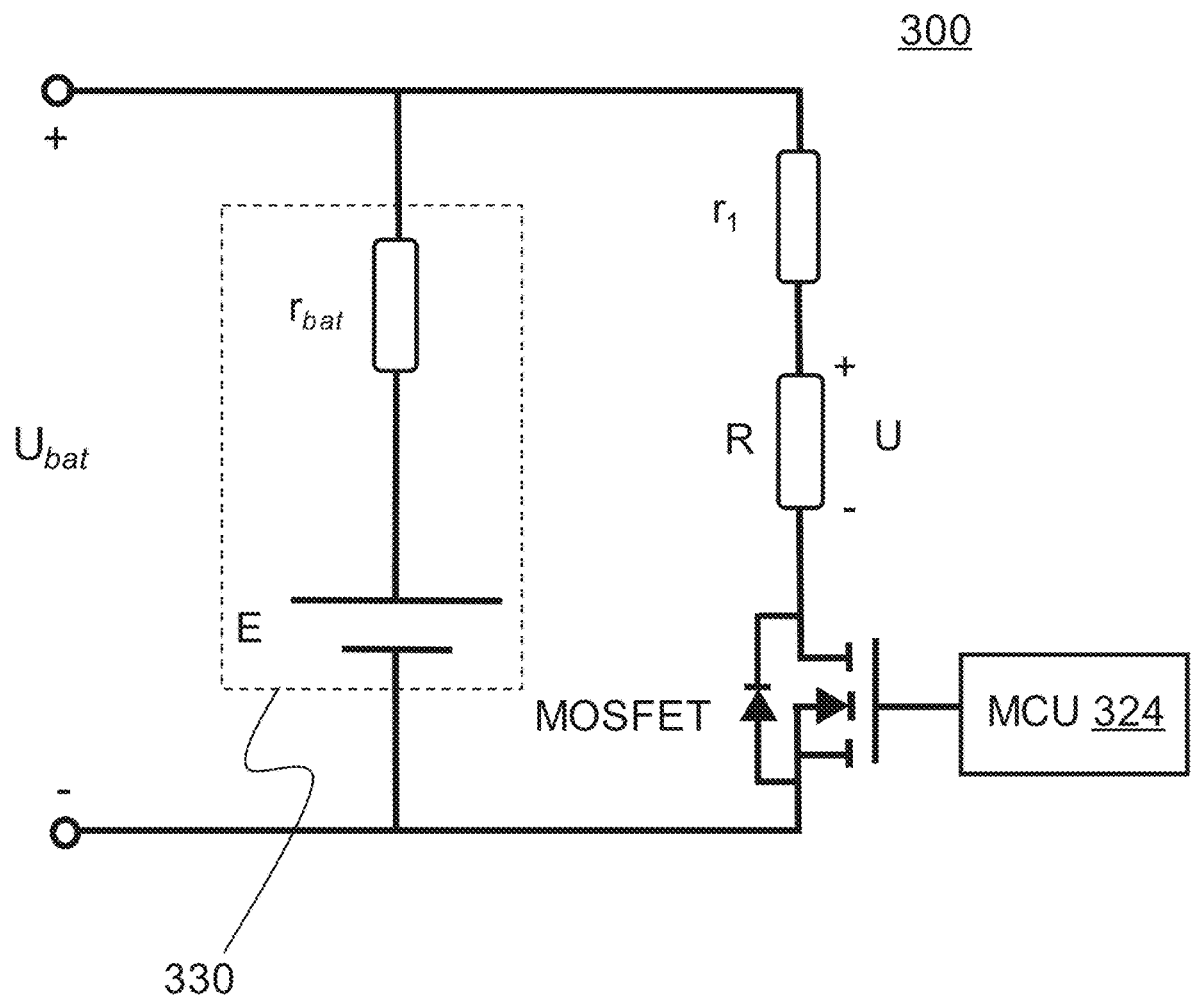
FIG. 3 shows an electrical circuit in accordance with one or more embodiments disclosed herein.

FIG. 3 shows an electrical circuit in accordance with one or more embodiments disclosed herein. The electrical circuit (300) is part of the monitoring circuitry (232) described in FIG. 2. In FIG. 3, the battery (330) is represented by the voltage source (E) and battery impedance ($r_{bat}$). The battery impedance ($r_{bat}$) is used to determine the SOH in accordance with embodiments disclosed herein. The electrical circuit (300) includes resistors ($r_1$, R) and a MOSFET connected in a series. This series of components are connected to the terminals of the battery (330). In the electrical circuit (300), $U_{BAT}$ represents the voltage across the BBU cell, while U represents the voltage across the resistor (R). The MOSFET of the electrical circuit (300) is controlled by a microcontroller (MCU) (324).

In the electrical circuit (300), the internal impedance of the MOSFET ($r_{moss}$) is much less than the impedance of each of the resistors ($r_1$ and R). The resistors ($r_1$ and R) are selected to allow the direct measurement of the voltage (U) across the resistor (R) by the MCU (324) and further selected to optimize the accuracy of the SOH measurement. As such, the voltage (U) across the resistor (R) may be determined using equation (1):

$$U \approx (U_{bat} * R)/(r_1 + R) \qquad (1).$$

In accordance with embodiments disclosed herein, U and $U_{BAT}$ are measured by the MCU (324) in accordance with equation (1). In addition, through operation of the MOSFET, E is also measured, being the open circuit voltage of the cell. From electrical circuit (300), the current through the resistor (R) may be expressed as equation (2):

$$I = U/R = (E - U_{bat})/R \qquad (2).$$

Using equations (1) and (2), the internal impedance of the battery ($r_{bat}$) may be determined using equation (3):

$$r_{bat} = R * (E - U_{bat})/U \qquad (3).$$

In accordance with embodiments disclosed herein, the SOH may be determined using the internal impedance of the battery ($r_{bat}$). It is known that the internal impedance of a battery may increase over time, leading to the end of life (EOL) of the battery. In embodiments disclosed herein, the SOH may be expressed as a percentage. The SOH may be determined in accordance with equation (4):

$$SOH = (R_{EOL} - r_{bat})/(R_{EOL} - r_{bat\_0}) * 100\% \qquad (4).$$

In equation (4), $R_{EOL}$ is the impedance of the battery when the battery is at its EOL; $r_{bat\_0}$ is original battery impedance; and $r_{bat}$ is the battery impedance determined by equation (3). The $R_{EOL}$ and the $r_{bat\_0}$ may be determined from specifications provided by a battery manufacturer. Also, the $r_{bat\_0}$ may be determined based on initial measurements, and the $R_{EOL}$ may be determined based on historical information. In some embodiments, a relationship between the $R_{EOL}$ and the $r_{bat\_0}$ may be determined. For example, it may be determined that $R_{EOL} = 2 * r_{bat\_0}$ based on data from a cell manufacturer. $R_{EOL}$ may also be determined by the requirements of a particular application of the BBU.

In accordance with embodiments disclosed herein, the current charge of the battery, the selection of resistors ($r_1$ and R), and a time of the measurement may all coordinate to contribute to the accuracy of the measurements. For example, it may be beneficial for the battery to have 20% of its capacity charged to ensure the accuracy of the SOH measurement. In some embodiments, the measured voltage (U) may be on the order of a few volts, for example ~3 V.

Figure 4:
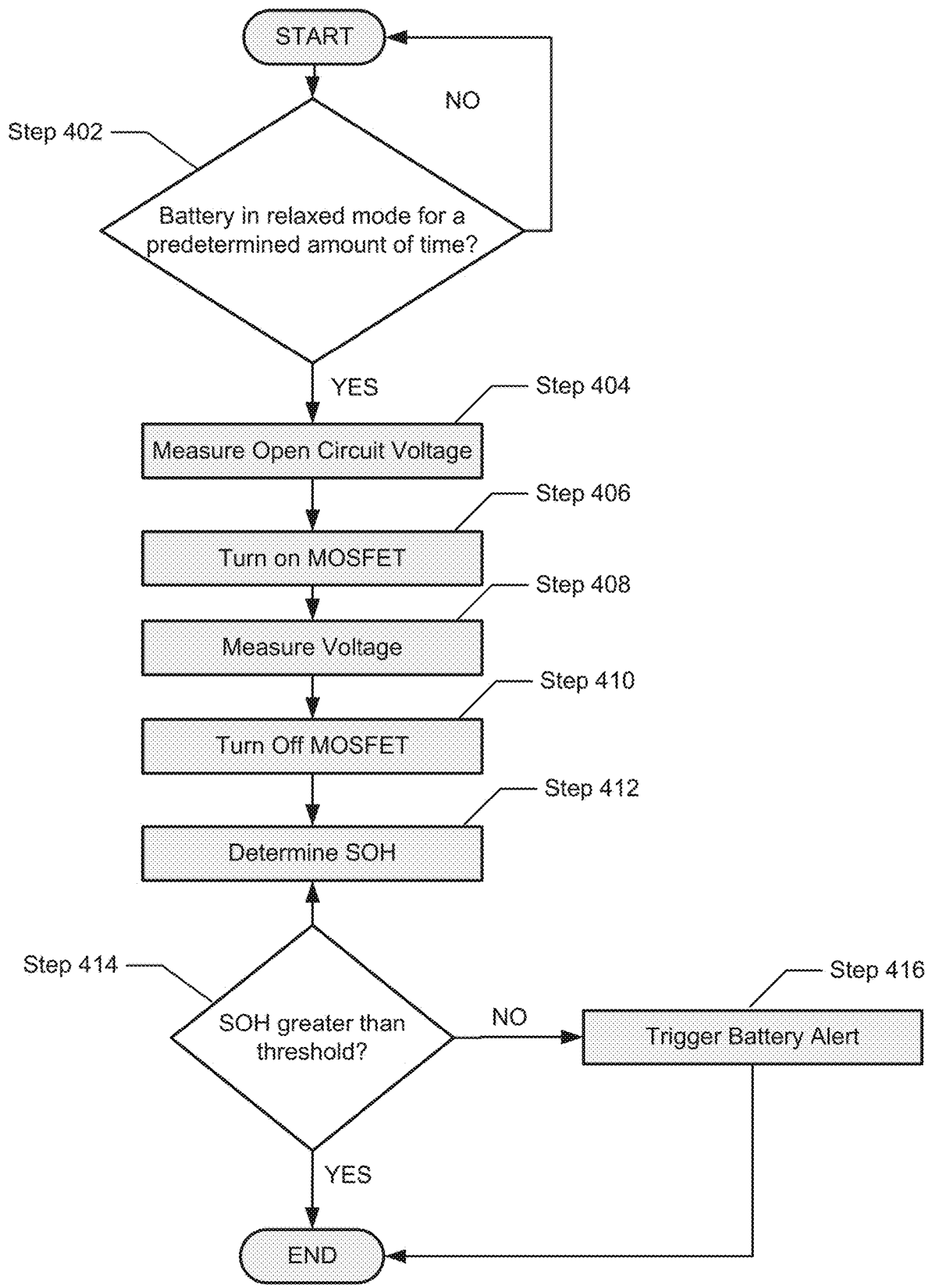
FIG. 4 shows a flow chart in accordance with one or more embodiments disclosed herein.

FIG. 4 shows a flow chart in accordance with one or more embodiments disclosed herein. FIG. 4 describes a process that may be performed by the MCU in accordance with embodiments disclosed herein. In step 402, it is determined whether the battery has been in a relaxed mode for a predetermined amount of time to ensure the accuracy of the subsequent measurements. In this context, relaxed mode refers to a lack of charging or discharging of the battery. In step 404, the open circuit voltage (E) is measured. Then, in step 406, the MOSFET is turned on, and the voltage (U) is measured in step 408. The MOSFET is then turned off in step 410. In accordance with embodiments disclosed herein, the entire measurement (steps 404 to 410) may take place on the order of milli-seconds (ms), for example, the measurement may take place over 10 ms.

In step 412, the SOH is determined using the measured open circuit voltage (E) and the measured voltage (U). For example, the internal impedance ($r_{bat}$) may be determined using equation (3) and the characteristics of the circuit, and the SOH may then be determined using equation (4) and characteristics of the battery.

In step 414, the SOH may be compared to a battery health threshold. The health threshold may be expressed as a percentage of battery life in accordance with embodiments disclosed herein. If the SOH is not greater than the threshold, a battery alert may be triggered in step 416. The alert may be transmitted by a communication interface of the BBU system in accordance with embodiments disclosed herein. If the SOH is greater than the threshold, the process ends.

Embodiments disclosed herein provide a direct, real time measurement of a SOH of a battery backup for computer systems. Embodiments avoid the use of gas gauges and modeling, as in a traditional BMS, and use a direct measurement of a battery impedance track that is capable of operating without any interventions from a system side. Embodiments may minimize the burden of battery backup management in storage platform designs.

The advantages discussed above throughout the detailed description should be understood as being examples associated with one or more problems being solved by embodiments of the invention. However, one or more embodiments of the invention disclosed herein should not be limited to solving the same/similar problems. The disclosed invention is broadly applicable to address a range of problems beyond those discussed herein.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A Backup Battery Unit (BBU) cell comprising:
a battery with an internal impedance;
monitoring circuitry connected to the battery for monitoring a Status of Health (SOH) of the battery, the monitoring circuitry comprising:
a MOSFET, a resistor, and a second resistor connected in series;
a master control unit (MCU) connected to the MOSFET for controlling the MOSFET and determining the SOH of the battery; and
wherein determining the SOH of the battery comprises calculating the internal impedance of the battery using a voltage across the resistor.

2. The BBU cell of claim 1, wherein the internal impedance is calculated using:

$$r_{bat}=R*(E-U_{bat})/U,$$

where $r_{bat}$ is the internal impedance, R is a resistance of the resistor, E is an open circuit voltage, U is the voltage, and $U_{bat}$ is an output voltage of the BBU cell.

3. The BBU cell of claim 1, wherein the voltage across the resistor is determined by measuring an output voltage of the BBU cell.

4. The BBU cell of claim 2, wherein the voltage across the resistor is calculated using:

$$U\approx(U_{bat}*R)/(r_1+R),$$

where $U_{bat}$ is the output voltage of the BBU cell, R is a resistance of the resistor, and $r_1$ is a second resistance of the second resistor connected in series with the resistor and the MOSFET.

5. The BBU cell of claim 1, further comprising:
a communication interface operatively connected to the BBU cell and configured to transmit an alert when the SOH is less than a health threshold.

6. A method of determining the Status of Health (SOH) of a Backup Battery Unit (BBU) cell, the method comprising:
measuring an open circuit voltage of monitoring circuitry connected to a battery of the BBU cell, the monitoring circuitry comprising a MOSFET, a resistor, and a second resistor connected in series;
turning on the MOSFET connected in series to the resistor and the second resistor; measuring an output voltage of the BBU cell;
determining a Status of Health (SOH) of the battery using the open circuit voltage and the output voltage of the BBU cell; and
wherein determining the SOH of the battery comprises calculating an internal impedance of the battery using a voltage across the resistor.

7. The method of claim 6, wherein the internal impedance is calculated using:

$$r_{bat}=R*(E-U_{bat})/U,$$

where $r_{bat}$ is the internal impedance, R is a resistance of the resistor, E is the open circuit voltage, U is the voltage, and $U_{bat}$ is the output voltage of the BBU cell.

8. The method of claim 6, wherein the voltage across the resistor is determined by the output voltage of the BBU cell.

9. The method of claim 8, wherein the voltage across the resistor is calculated using:

$$U\approx(U_{bat}*R)/(r_1+R),$$

where $U_{bat}$ is the output voltage of the BBU cell, R is a resistance of the resistor, and $r_1$ is a second resistance of the second resistor connected in series with the resistor and the MOSFET.

10. The method of claim 6, further comprising:
transmitting an alert when the SOH is less than a health threshold.

11. The method of claim 6, further comprising:
determining that the battery has been in a relaxed mode for a predetermined amount of time before measuring the open circuit voltage.

12. A system for providing backup power, the system comprising: a storage system comprising one or more storage units;
- a Backup Battery Unit (BBU) for providing a power source to the one or more storage units, wherein the BBU comprises one or more BBU cells, each BBU cell comprising:
- a battery with an internal impedance;
- monitoring circuitry connected to the battery for monitoring a Status of Health (SOH) of the battery, the monitoring circuitry comprising: a MOSFET, a resistor, and a second resistor connected in series;
- a master control unit (MCU) connected to the MOSFET for controlling the MOSFET and determining the SOH of the battery; and
- wherein determining the SOH of the battery comprises calculating the internal impedance of the battery using a voltage across the resistor.

13. The system of claim 12, wherein the internal impedance is calculated using:

$$r_{bat} = R*(E - U_{bat})/U,$$

where $r_{bat}$ is the internal impedance, R is a resistance of the resistor, E is an open circuit voltage, U is the voltage, and $U_{bat}$ is an output voltage of the BBU cell.

14. The system of claim 12, wherein the voltage across the resistor is determined by measuring an output voltage of the BBU cell.

15. The system of claim 14, wherein the voltage across the resistor is calculated using:

$$U \approx (U_{bat}*R)/(r_1 + R),$$

where $U_{bat}$ is the output voltage of the BBU cell, R is a resistance of the resistor, and $r_1$ is a second resistance of the second resistor connected in series with the resistor and the MOSFET.

16. The system of claim 12, further comprising:
- a controller that receives an alert from a communication interface of the BBU when the SOH is less than a health threshold.

17. The system of claim 12, wherein the one or more storage units comprise cache memory.

* * * * *